(12) United States Patent
Sato et al.

(10) Patent No.: US 7,397,112 B2
(45) Date of Patent: Jul. 8, 2008

(54) SEMICONDUCTOR PACKAGE AND LEAD FRAME THEREFOR

(75) Inventors: Takashi Sato, Hamamatsu (JP); Kenichi Shirasaka, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 11/312,597

(22) Filed: Dec. 21, 2005

(65) Prior Publication Data

US 2006/0138615 A1    Jun. 29, 2006

(30) Foreign Application Priority Data

Dec. 24, 2004    (JP) ........................... P2004-372919

(51) Int. Cl.
*H01L 23/495* (2006.01)

(52) U.S. Cl. ...................... 257/666; 257/676

(58) Field of Classification Search ................ 257/666, 257/676, 787, 778
See application file for complete search history.

(56) References Cited

U.S. PATENT DOCUMENTS

| 5,327,008 | A | * | 7/1994 | Djennas et al. ............. 257/666 |
| 6,208,023 | B1 | * | 3/2001 | Nakayama et al. .......... 257/696 |
| 6,400,004 | B1 | * | 6/2002 | Fan et al. .................... 257/666 |
| 6,608,366 | B1 | | 8/2003 | Fogelson et al. |
| 6,909,166 | B2 | | 6/2005 | Frezza et al. |

FOREIGN PATENT DOCUMENTS

| CN | 1534776 A | 10/2004 |
| JP | 2-302068 A | 12/1990 |
| JP | 4-27148 A | 1/1992 |
| JP | 4-103154 A | 4/1992 |
| JP | 04-134852 | 5/1992 |
| JP | 4-171855 A | 6/1992 |
| JP | 5-309116 A | 11/1993 |
| JP | 6-334090 A | 12/1994 |
| JP | 07-030043 | 1/1995 |
| JP | 8-125088 A | 5/1996 |
| JP | 10-303358 A | 11/1998 |
| JP | 11-008261 | 1/1999 |
| JP | 11-354705 A | 12/1999 |
| JP | 2002-164497 A | 6/2002 |
| JP | 2002-246528 A | 8/2002 |
| JP | 2002-314024 | 10/2002 |
| JP | 2002-359336 | 12/2002 |
| TW | 200425455 | 11/2004 |

OTHER PUBLICATIONS

Harper, Electronic Packaging and Interconnection Handbook, McGraw-Hill, Inc., New York, p. 618 (1991).
Korean Office Action dated Dec. 21, 2005 (and English translation of same).

* cited by examiner

*Primary Examiner*—Roy K Potter
(74) *Attorney, Agent, or Firm*—Dickstein, Shapiro, LLP.

(57) ABSTRACT

A lead frame adapted to a semiconductor package, which is enclosed in a molded resin body and is connected with a board, is formed by processing a thin metal plate so as to include a stage for mounting a semiconductor chip thereon, a plurality of leads arranged to encompass the stage, and a plurality of lead interconnecting members (or dam bars) for interconnecting the leads together. At least one recess, which is of a circular shape or a non-circular shape, is formed on the backside of the lead (or the lead interconnecting member), which is substantially arranged in the same plane with a terminal surface of the molded resin body. Due to the formation of the recess that is subjected to plating, it is possible to increase the joining strength between the lead and solder; hence, it is possible to improve reliability regarding electric connection between the semiconductor package and board.

19 Claims, 13 Drawing Sheets

SEMICONDUCTOR PACKAGE AND LEAD FRAME THEREFOR

BACKGROUND OF THE INVENTION

1. Field of the Invention

The present invention relates to semiconductor packages encapsulating semiconductor chips connected to substrates and boards. The present invention also relates to lead frames for use in semiconductor packages.

The present application claims priority on Japanese Patent Application No. 2004-372919, the content of which is incorporated herein by reference.

2. Description of the Related Art

Conventionally, there are available a variety of semiconductor packages such as QFN (Quad Flat Non-Leaded) packages having plural leads partially exposed on terminal surfaces and side surfaces lying in thickness directions of molded resin bodies. An example of a conventionally-know semiconductor package is disclosed in Japanese Unexamined Patent Application Publication No. 2002-314024. FIG. 14 shows the layout of a lead frame 51 for use in a QFN package, which is produced using a lead frame 51 including a stage 55 for mounting a semiconductor chip 53 thereon, plural leads 57 formed in the periphery of the stage 55, and dam bars 59 for interconnecting the leads 57 together. The lead frame 51 is produced by performing press working and/or etching on a thin metal plate.

In the manufacturing of the lead frame 51, the semiconductor chip 53 is bonded onto the surface of the stage 55 first; then, pads of the semiconductor chip 53 are electrically connected to the leads 57 via bonding wires 61. Next, as shown in FIG. 15, a molded resin body 63 is formed to integrally fix the semiconductor chip 53, the stage 55, the bonding wires 61, and the bonded portions of the leads 57 therein. Herein, a backside 57 of the lead 57 is formed in the same plane with a backside 63a of the molded resin body 63.

The lead 57 is partially subjected to plating with respect to a surface 57b and a backside 57a, which are exposed to the exterior of a QFN package, thus forming a plated layer 65 for soldering. The plated layer 65 is used to improve the anti-wetting ability of solder for the lead 57. Lastly, the dam bar 59 and a projecting portion 57c of the lead 57 projecting to the exterior are subjected to cutting along a cutting line A, thus completing the manufacturing of a QFN package in which the leads 57 are electrically independent from each other.

The aforementioned QFN package (denoted by a reference numeral 80) is mounted on a board 71 in such a way that, as shown in FIG. 16, the backside 57a of the lead 57 and a land 73 of the board 71 are bonded together via a solder 67. This allows the QFN package 80 to be electrically connected to the board 71. The joining strength realized by the solder 67, by which the lead 57 and the land 73 are joined, depends upon the overall area of the backside 57a of the lead 57, which is exposed to a lower surface 63a of the molded resin body 63.

Due to recent tendencies regarding microelectronics and devices, there is a demand for improvement of reliability regarding electric connections established between QFN packages and boards. In the case of the QFN package 80 connected to the board 71, the overall area of the backside 57a of the lead 57, which are exposed to the lower surface 63a of the molded resin body 63, is restricted by prescribed standards; hence, it is very difficult to improve the joining strength between the lead 57 and the land 73 by way of a simple increase of the overall area of the backside 57a of the lead 57. In other words, under the present circumstances, it is very difficult to further improve reliability regarding electric connection between the QFN package 80 and the board 71.

SUMMARY OF THE INVENTION

It is an object of the present invention to provide a semiconductor package, which is further improved in terms of reliability regarding electric connection with a substrate or board. In addition, it is another object of the present invention to provide a lead frame that is designed to suit the aforementioned semiconductor package.

In a first aspect of the present invention, a lead frame that is adapted to a semiconductor package enclosed in a molded resin body and that is formed by processing a thin metal plate is constituted by a stage on which a semiconductor chip is mounted, a plurality of leads that are arranged to encompass the stage and that are partially exposed to a terminal surface lying in a thickness direction of the molded resin body, and a plurality of lead interconnecting members for connecting the leads together, wherein at least one recess is formed with respect to the terminal surface of the molded resin body. The recess is subjected to plating so as to increase the overall area of solder for establishing electric connection between the lead and a board (or a substrate). That is, it is possible to improve the joining strength between the lead and solder without increasing the overall area of the backside of each lead, which is exposed to the terminal surface (or lower surface) of the molded resin body.

In the above, at least one through hole is formed to run through the lead or the lead interconnecting member in its thickness direction at a prescribed position allowing a cutting line, by which the leads are electrically isolated from each other, to pass therethrough. Even when the leads and/or the lead interconnecting members are subjected to cutting after plating therefor, plated layers remain on interior walls of through holes partially occupying the side surfaces of the leads; hence, it is possible to increase the overall area of solder adhered to the leads; thus, it is possible to further improve the joining strength between the leads and solder.

In the above, it is possible to enlarge the through hole, which is formed in the lead interconnecting member, in a direction for alignment of the leads. Due to the formation of such a relatively large through hole in the lead interconnecting member, it is possible to increase the overall plated area remaining on the side surface of the leads after completion of cutting of the lead interconnecting member; hence, it is possible to increase the overall area of the solder adhered to the leads.

In a second aspect of the present invention, a semiconductor package enclosed in a molded resin body and encapsulating a plurality of leads, which are partially exposed to a terminal surface lying in a thickness direction of the molded resin body, is characterized in that at least one recess is formed at a prescribed position of the lead that is exposed to the terminal surface of the molded resin body. Due to the formation of the recess, it is possible to increase the overall area of solder adhered to the lead; hence, it is possible to improve the joining strength between the lead and solder.

In the above, the lead is exposed to a side surface adjacent to the terminal surface of the molded resin body, and wherein the recess is opened externally from the side surface of the molded resin body. This makes it possible for a human inspector to easily inspect the condition of joining between the lead and solder from the exterior of the semiconductor package.

The recess can be formed in a circular shape or a non-circular shape. When a plurality of recesses are formed and aligned in a longitudinal direction of the lead, at least one of them is positioned to allow a cutting line, by which the lead is subjected to cutting, to pass therethrough.

When the aforementioned semiconductor package using the aforementioned lead frame is mounted onto a board having lands, it is possible to noticeably improve reliability regarding electric connection between the leads and lands.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

FIGS. 1, 2A, 2B, 3A, 3B, 4A, and 4B show essential parts of a semiconductor package in accordance with a preferred embodiment of the prevent invention. The semiconductor package of the first embodiment is produced using a lead frame that is formed by performing either press working or etching or both of them on a thin metal plate composed of copper.

Figure 1:
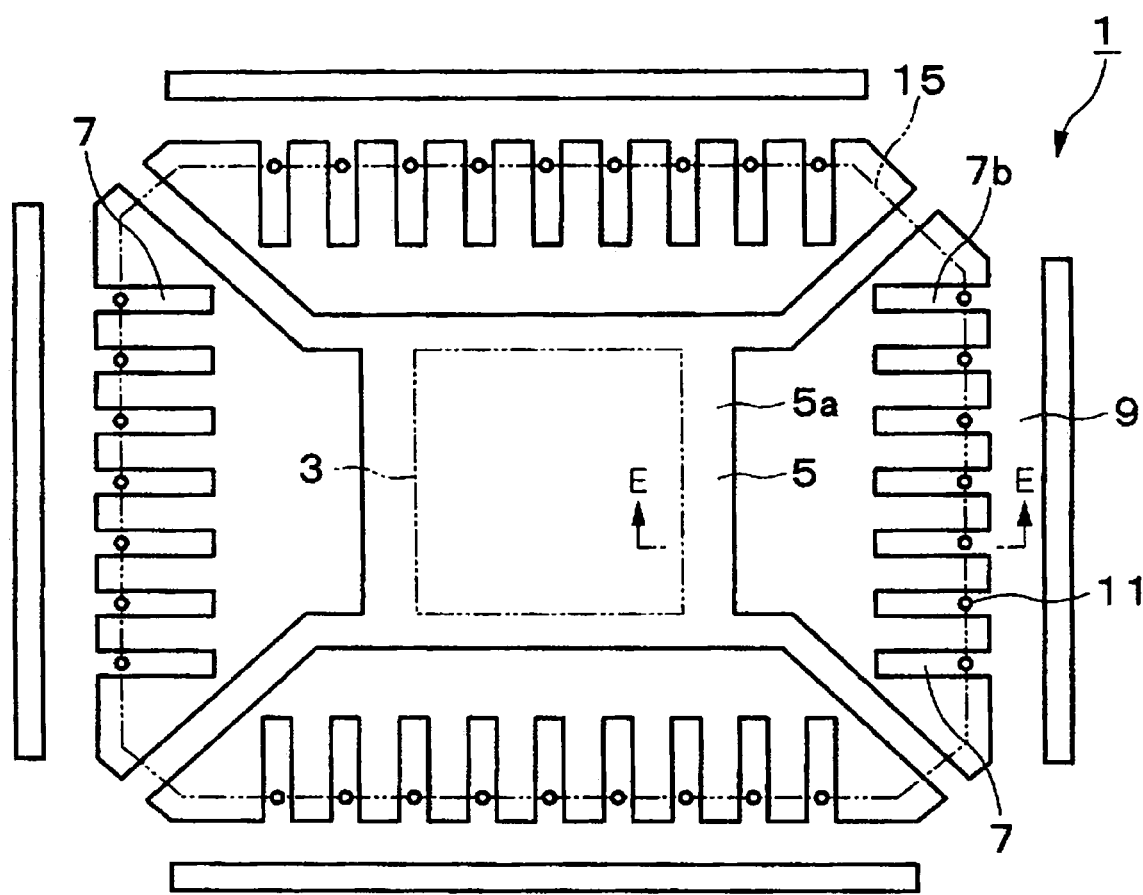
FIG. 1 is a plan view showing a lead frame in accordance with a first embodiment of the present invention.

Specifically, a lead frame 1 shown in FIG. 1 includes a stage 5 for mounting a semiconductor chip 3 thereon, plural leads 7 formed in the periphery of the stage 5, and dam bars (i.e., lead interconnecting members) 9 for interconnecting the leads 7 together.

The leads 7 have through holes 11, which run through the lead frame 1 in its thickness direction. The through holes 11 are formed to lie in an alignment direction of the leads 7. The through holes 11 are formed by press working or etching.

Figure 2A:
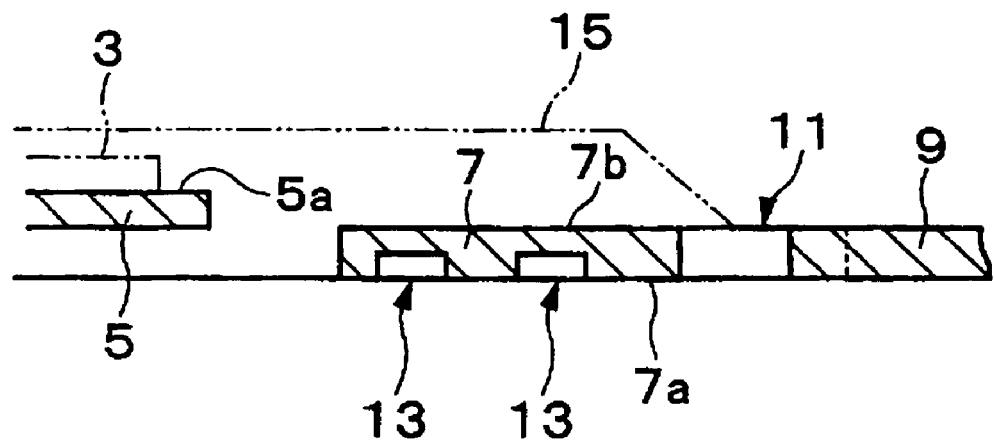
FIG. 2A is a cross-sectional view taken along line E-E in FIG. 1.
Figure 2B:
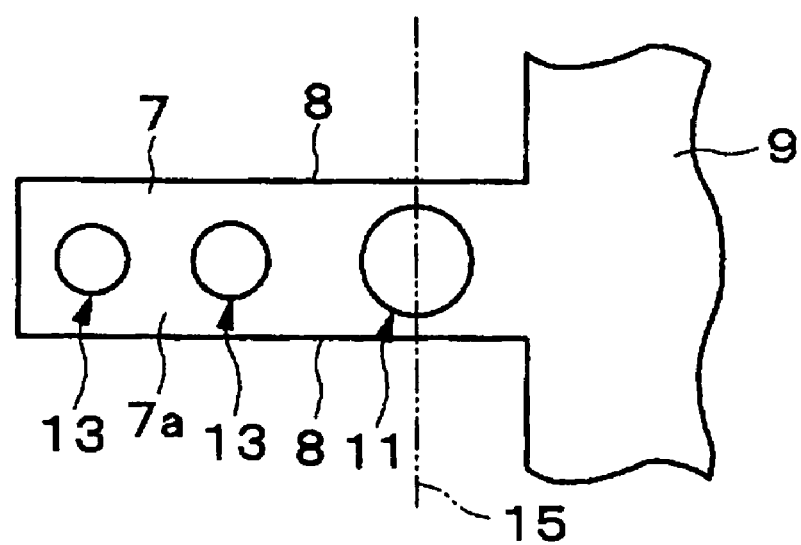
FIG. 2B is an enlarged plan view showing prescribed parts arranged on the backside of a lead included in the lead frame shown in FIG. 1.

The leads 7 each have terminal surfaces 7a (hereinafter, referred to as backsides 7a), each of which has two recesses 13 as shown in FIGS. 2A and 2B. The recesses 13 are formed at prescribed positions close to the stage 5 in comparison with the position of the through hole 11. The recesses 13 are each formed in a circular shape in a plan view by way of etching in such a way that they are not opened in a side surface 8 lying in the thickness direction of a lead 7.

Next, a manufacturing method for a semiconductor package using the aforementioned lead frame 1 will be described in detail.

Figure 3A:
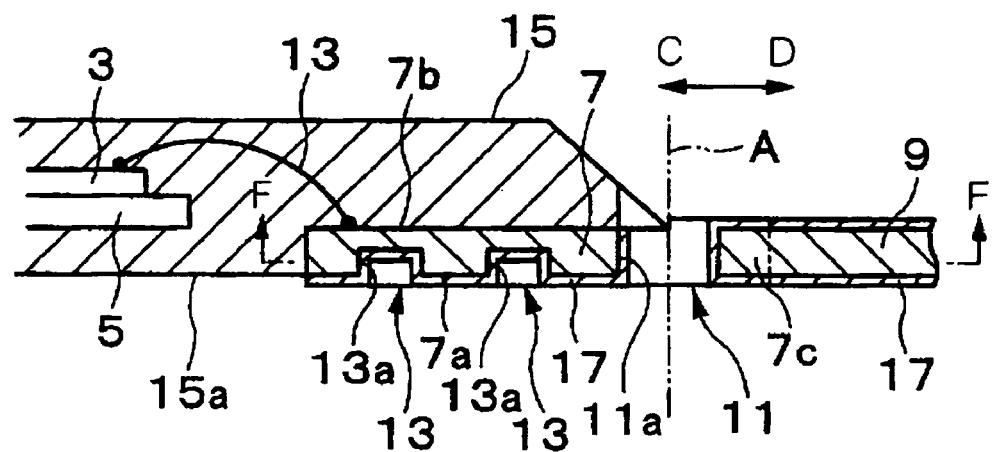
FIG. 3A is a cross-sectional view showing prescribed parts of a semiconductor package encapsulating the lead frame shown in FIG. 1.
Figure 3B:
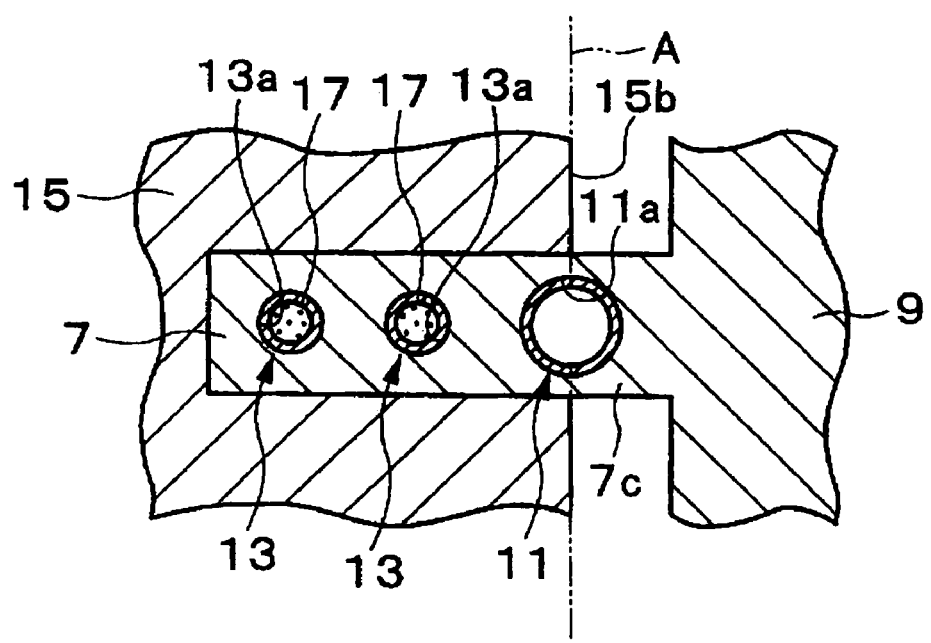
FIG. 3B is a cross-sectional view taken along line F-F in FIG. 3A.

First, a semiconductor chip 3 is bonded onto a surface 5a of a stage 5, and leads 7 are electrically connected to pads of the semiconductor chip 3 via metal bonding wires 13. As shown in FIGS. 3A and 3B, each bonding wire 13 is bonded onto a surface 7b of each lead 7 at a prescribed position that is close to the stage 5 in comparison with the position of a through hole 11.

Then, the lead frame 1 is arranged in a metal mold (not shown), into which a melted resin is injected so as to form a molded resin body 15 that integrally fixes the semiconductor chip 3, the stage 5, the bonding wires 13, and the bonded portions of the leads 7 therein.

A lower surface (or a terminal surface) 15a of the molded resin body 15 is formed in the same plane with backsides 7a of the leads 7. In addition, a side surface 15b lying in the thickness direction of the molded resin body 15 is positioned to suit a cutting line A, at which the leads 7 are subjected to cutting. That is, the side surface 15b of the molded resin body 15 is formed at a prescribed position substantially corresponding to a center of the through hole 11 lying in a longitudinal direction (i.e., a direction C-D) of the leads 7. Furthermore, the molded resin body 15 is formed to prevent resin from being introduced into the through hole 11.

After the formation of the molded resin body 15, the exposed portions of the surfaces 7b and backsides 7a of the leads 7, which are exposed to the exterior of the molded resin body 15, as well as interior walls 11a of the through holes 11 and interior walls of the recesses 13 are subjected to plating, thus forming plated layers 17 for soldering as shown in FIG. 3B.

Lastly, projecting portions 7c of the leads 7, which project externally in a direction D from the side surfaces of the molded resin body 15, and the dam bars 9 are subjected to cutting along the cutting line A, thus completing the manufacturing of a semiconductor package in which the leads 7 are electrically independent from each other.

Figure 4A:
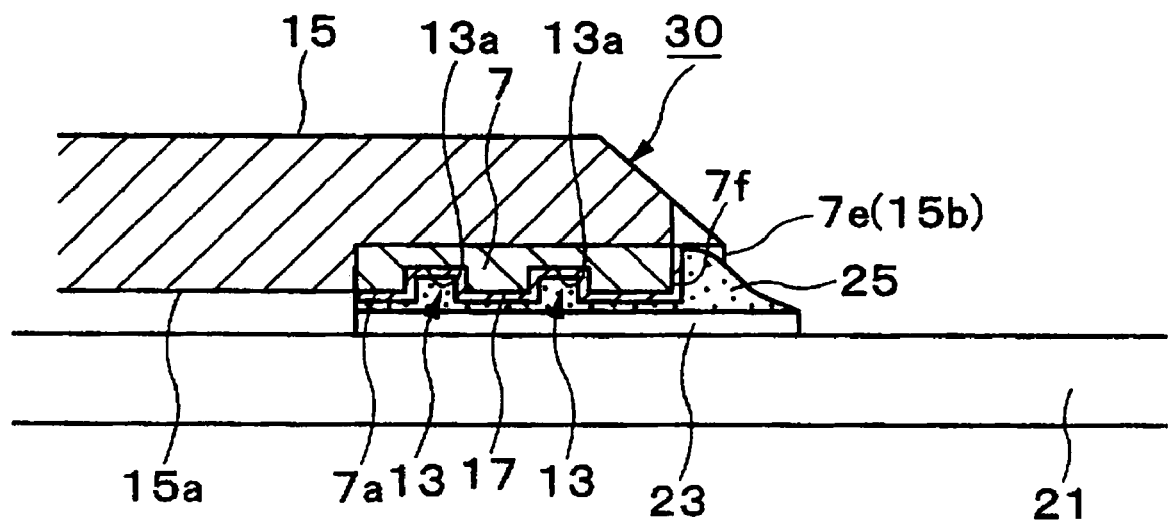
FIG. 4A is a cross-sectional view showing the semiconductor package mounted on a board.
Figure 4B:
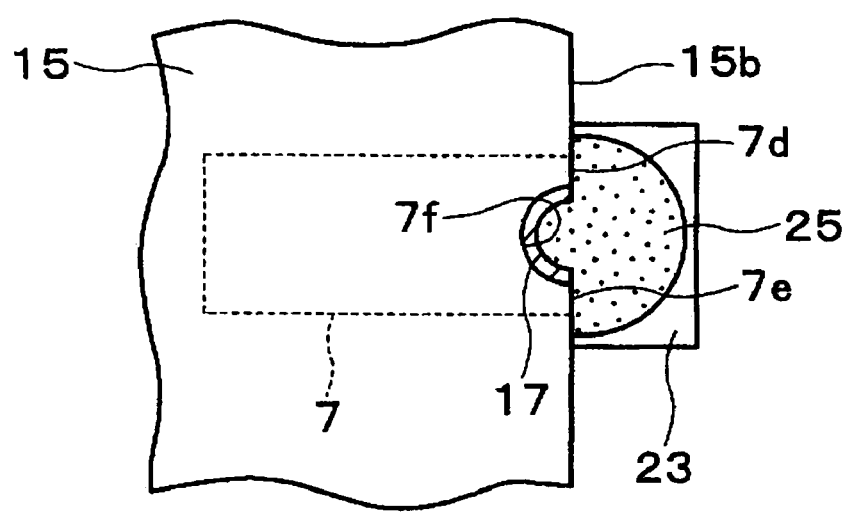
FIG. 4B is an enlarged plan view showing prescribed parts of the semiconductor package shown in FIG. 4A.

As described above, it is possible to produce a semiconductor package 30 of a QFN type, which as shown in FIGS. 4A and 4B, the lead 7 does not project from a side surface 15b of the molded resin body 15. In the semiconductor package 30, a side surface 7d of the lead 7, which is exposed to the exterior and which lies in a thickness direction, is formed by cutting the lead 7 along the aforementioned cutting line A. The side surface 7d of the lead 7 includes a cut surface 7e, which shares the plane of the side surface 15b of the molded resin body 15, and a concave surface (or a plated surface) 7f, which forms a part of the interior surface 11a of the through hole 11. A plated layer 17 is formed on the concave surface 7f.

In order to mount the semiconductor package 30 on a board 21 (e.g., a substrate or a printed-circuit board), the lower surface 15a of the molded resin body 15 is positioned opposite the surface of the board 21; and the lead 7 is electrically connected to a land 23 of the board 21 via a solder 25. In this state, the solder 25 joins the backside 7a of the lead 7, the concave surface 7f, and the interior wall 13a of the recess 13.

Due to the aforementioned structure of the semiconductor package 30 in which the plated layers 17 are formed with respect to the backside 7a of the lead 7 as well as the concave surface 7f of the side surface 7d and the interior wall 13a of the recess 13, it is possible to improve the anti-wetting ability and to increase the overall area available for the solder 25 attached to the lead 7; hence, it is possible to improve the joining strength between the lead 7 and the solder 25.

In the condition in which the semiconductor package 30 is arranged on the board 21, the plated layer 17 formed on the concave surface 7f is exposed to the exterior. This makes it possible for a human inspector to visually inspect the condition of joining established between the lead 7 and the solder 25.

Figure 5:
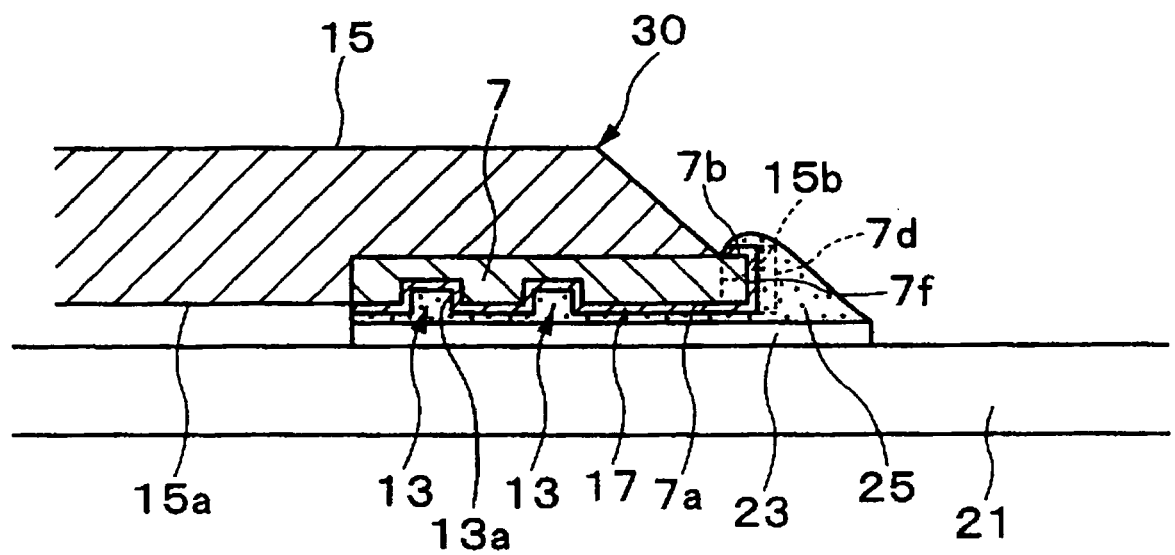
FIG. 5 is a cross-sectional view a modification of the semiconductor package mounted on the board.

The present embodiment is designed such that the cut surface 7e of the lead 7 shares the plane of the side surface 15b of the molded resin body 15. This feature is not a limitation in the present invention. That is, as shown in FIG. 5, for example, it can be positioned to project externally from the side surface 15b. In this case, the surface 7b of the lead 7 is partially exposed to the exterior; hence, the plated layer 17 remains on the exposed surface 7b of the lead 7. This allows the solder 25 to join the surface 7b of the lead 7 in addition to the backside 7a of the lead 7, the concave surface 7f, and the interior wall 13a of the recess 13 when the semiconductor package 30 is mounted on the board 21. Thus, it is possible to further improve the reliability regarding the electric connection between the lead 7 and the land 23.

Figure 6:
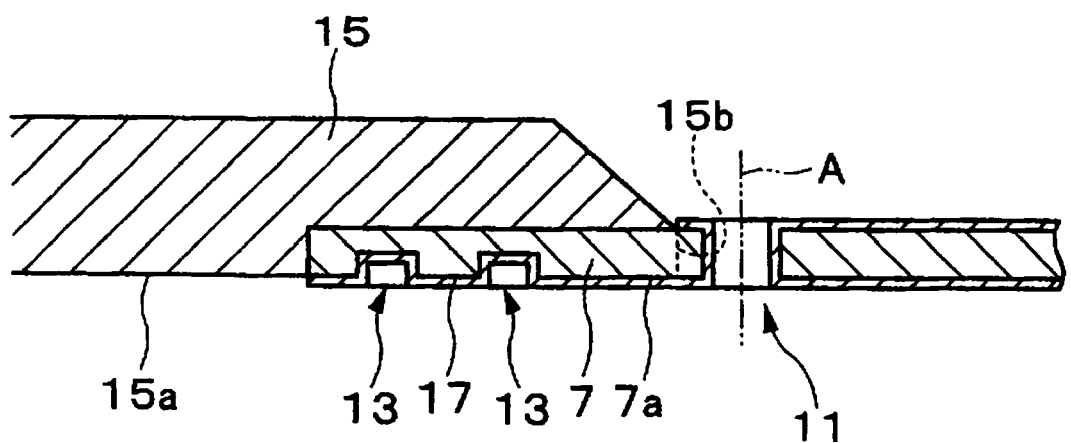
FIG. 6 is a cross-sectional view showing the semiconductor package before its lead is cut out.

In the above, it is possible to partially modify the semiconductor package 30 in such a way that as shown in FIG. 6, the through hole 11 is shifted in position from the exterior of the side surface 15b of the molded resin body 15; alternatively, the through hole 11 may be expanded in a direction outwardly from the exterior of the side surface 15b.

In the present embodiment, the cut position of the lead 7 substantially matches a half of the length of the through hole 11 lying in a longitudinal direction of the lead 7. This is not a limitation. That is, it is required that the cut position be lying to pass through the through hole 11.

In the present embodiment, the through hole 11 is formed with respect to each lead 7. This is not a restriction. That is, a through hole or through holes can be formed in the dam bar 9 interconnecting the plural leads 7.

Figure 7:
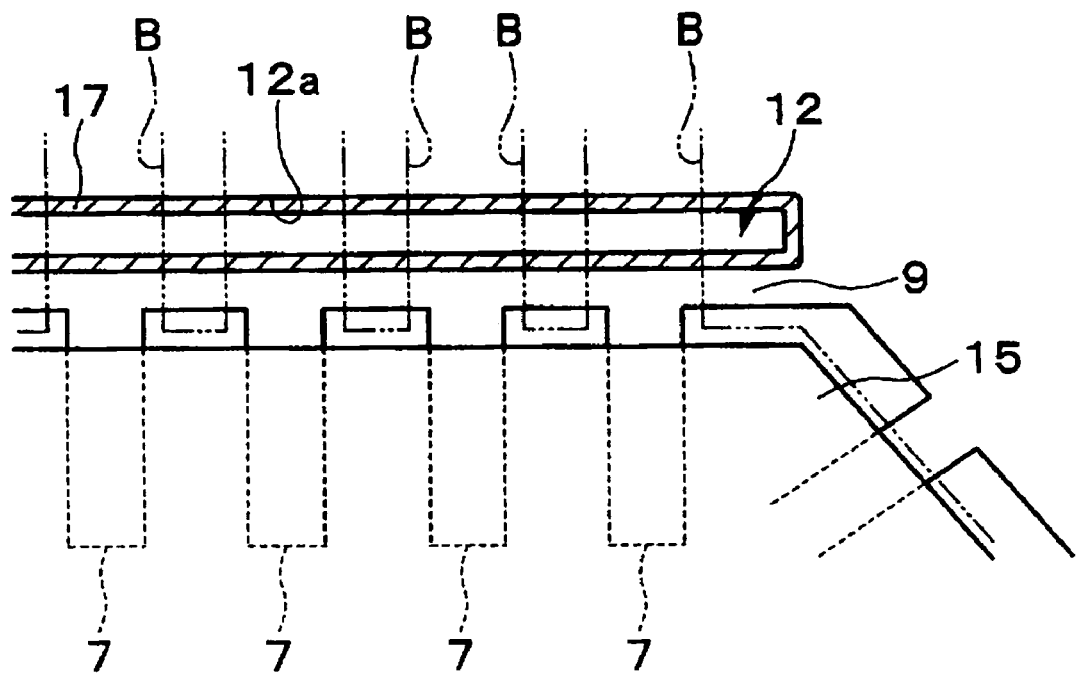
FIG. 7 is a cross-sectional view showing another modification of the semiconductor package before its lead interconnecting member is cut out.
Figure 8:
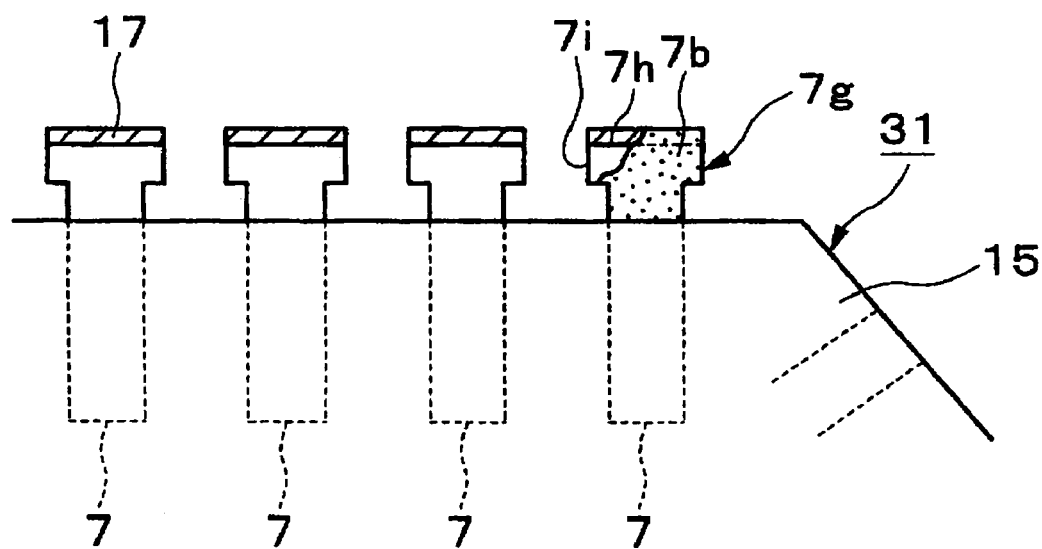
FIG. 8 is a cross-sectional view showing the semiconductor package of FIG. 7, in which leads are isolated from each other by way of cutting.

Specifically, as shown in FIG. 7, for example, an elongated through hole 12 is formed over the plural leads 7 in a direction for alignment of the leads 7 in the formation of a lead frame. In addition, the leads 7, the dam bar 9, and an interior wall 12a of the through hole 12 are subjected to plating; then, the dam bar 9 is subjected to cutting along cutting lines B. Thus, it is possible to produce a semiconductor package 31 in which as shown in FIG. 8, the leads 7 are electrically independent from each other.

In the aforementioned semiconductor package 31, a side surface 7g lying in the thickness direction of each lead 7 includes a plated surface 7h, on which a plated layer 17 is formed, and a cut surface 7i adjacent the plated surface 7h. Herein, the surface 7b adjacent the side surface 7g of the lead 7 is subjected to plating as well.

In the above, it is possible to easily increase the overall area of the plated surface 7f of the lead 7 because the through hole 12 is larger than the through hole 11, which is formed with respect to each lead 7. That is, it is possible to further increase the overall area available for solder adhered to the lead 7; hence, it is possible to reliably increase the joining strength between the lead 7 and the solder.

The through hole 12 is not necessarily formed to cover the plural leads 7 along the dam bar 9. That is, it is required that the through hole be formed at a desired position matching a cutting line, which is used to electrically isolate the leads 7 from each other. For example, through holes can be respectively formed to match the cutting lines B, each of which is drawn between the adjacent leads 7.

When visual inspection is not performed with regard to the condition of joining established between the lead(s) 7 and solder, it is not necessarily required to form the through holes 11 with respect to the leads 7 and to form the through hole 12 with respect to the dam bar 9 covering the plural leads 7. The present embodiment requires that at least the recess 13 be formed on the backside 7a of the lead 7 exposed to the lower surface 15a of the molded resin body 15.

Figure 9A:
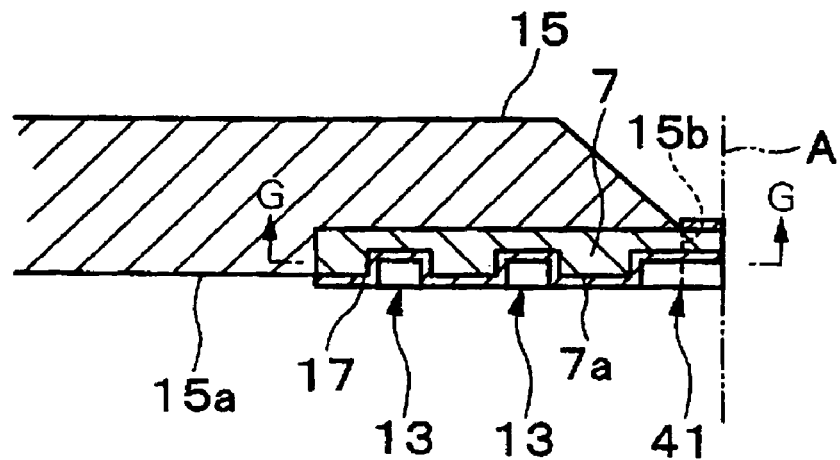
FIG. 9A is a cross-sectional view showing a further modification of the semiconductor package, in which a concave recess is additionally formed on the backside of a lead.
Figure 9B:
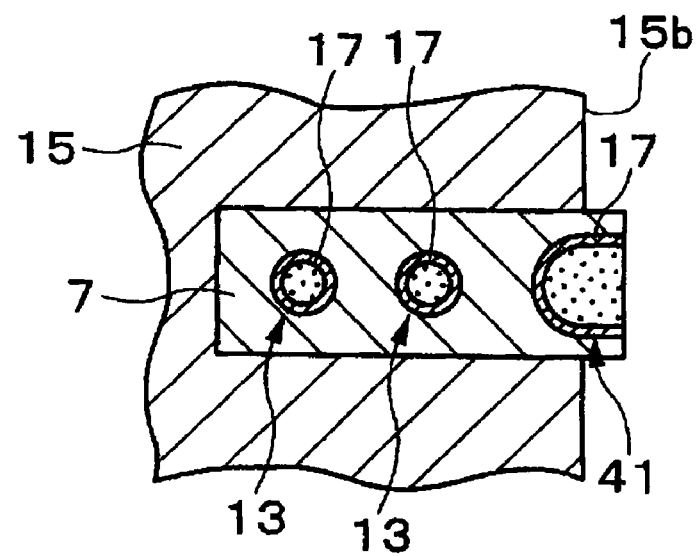
FIG. 9B is an enlarged cross-sectional view taken along line G-G in FIG. 9A.

It is possible to modify the present embodiment such that as shown in FIGS. 9A and 9B, a concave recess 41 is additionally formed on the backside 7a of the lead 7 at a prescribed position substantially matching a cutting line A, which is used to electrically isolate the leads 7 from each other. The concave recess 41 is opened on the exterior of the side surface 15b of the molded resin body 15 upon the cutting of the lead 7 along the cutting line A.

Figure 10A:
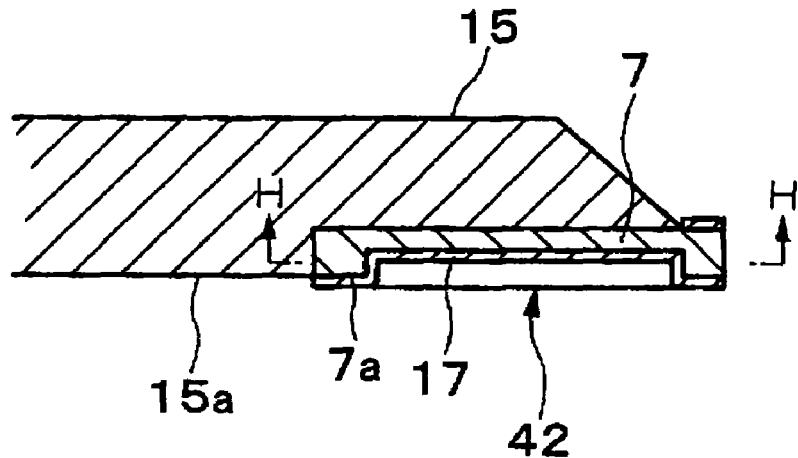
FIG. 10A is a cross-sectional view showing a further modification of the semiconductor package, in which an elongated recess is formed on the backside of a lead.
Figure 10B:
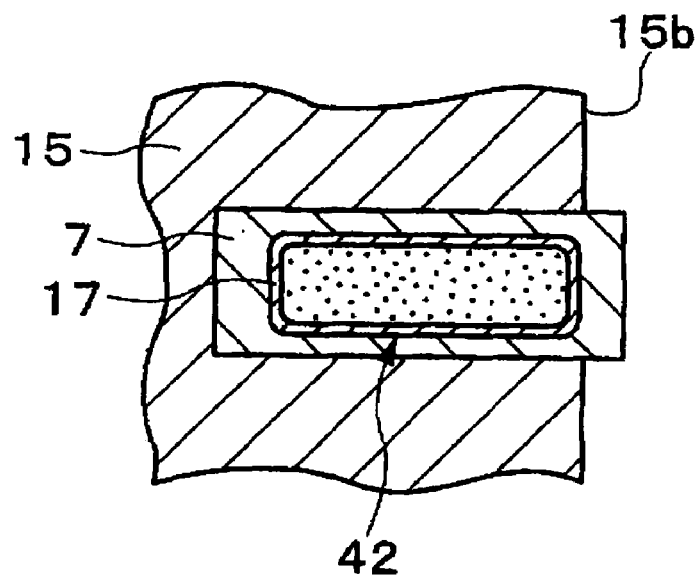
FIG. 10B is an enlarged cross-sectional view taken along line H-H in FIG. 10A.

The present embodiment is not necessarily designed such that the two recesses 13 are formed on the backside 7a of the lead 7. That is, the present embodiment requires that at least one recess be formed on the backside 7a of the lead 7. As shown in FIGS. 10A and 10B, for example, an elongated recess 42 only can be formed on the backside 7a of the lead 7. It is required that the size of the elongated recess 42 be smaller than the overall area of the backside 7a of the lead 7 in view of the lower surface 15a of the molded resin body 15.

Figure 11A:
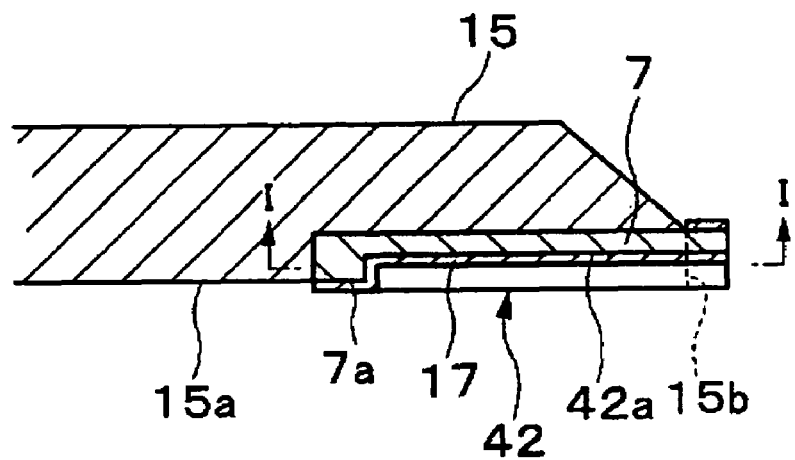
FIG. 11A is a cross-sectional view showing a further modification of the semiconductor package, in which the elongated recess is opened on a side surface of a molded resin body.
Figure 11B:
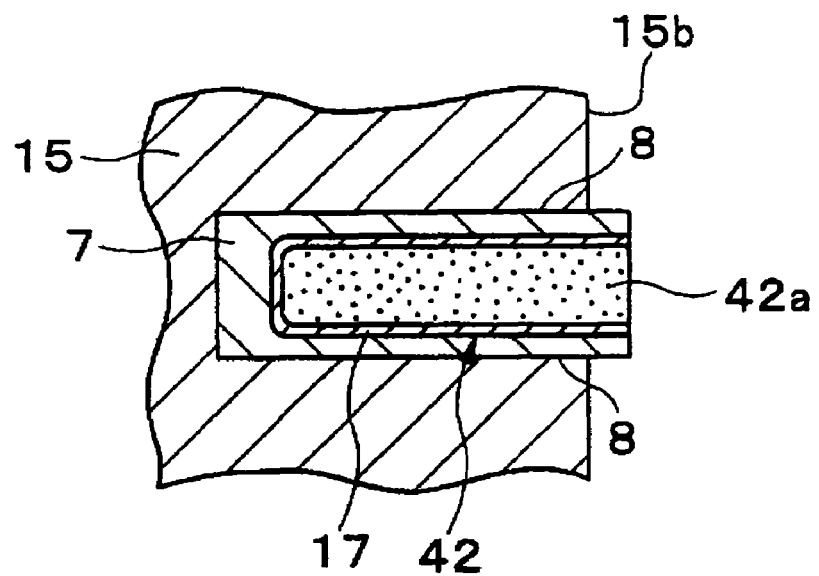
FIG. 11B is an enlarged cross-sectional view taken along line I-I in FIG. 11A.

It is possible to further modify the semiconductor package such that, as shown in FIGS. 11A and 11B, the elongated recess 42 is formed on the exterior of the side surface 15b of the molded resin body 15. This modification allows a human inspector to perform visual inspection of the exterior with respect to the condition of joining between the lead 7 and solder because an interior wall 42a of the elongated recess 42 can be visually checked from the exterior even when the backside 7a of the lead 7 is brought into contact with the surface of a land on a board. Thus, it is possible to improve reliability regarding electric connection between the lead 7 and a land on a board.

Figure 12B:
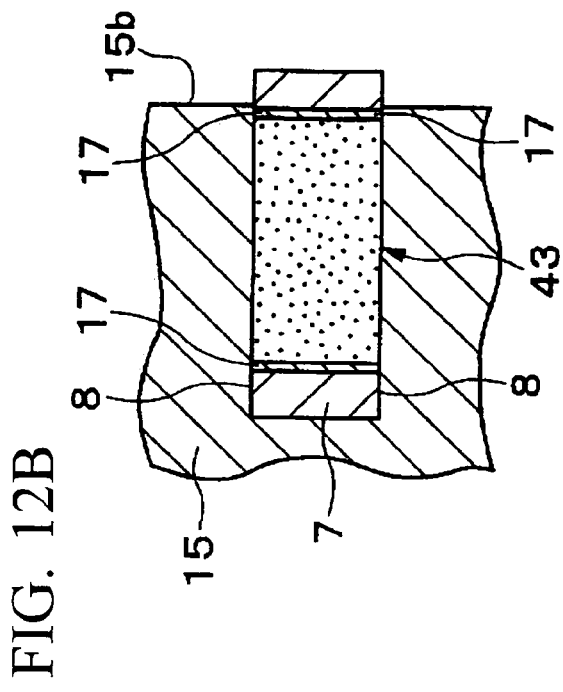
FIG. 12B is an enlarged cross-sectional view showing a further modification of the semiconductor package, in which a single recess is formed with respect to a lead.
Figure 12A:
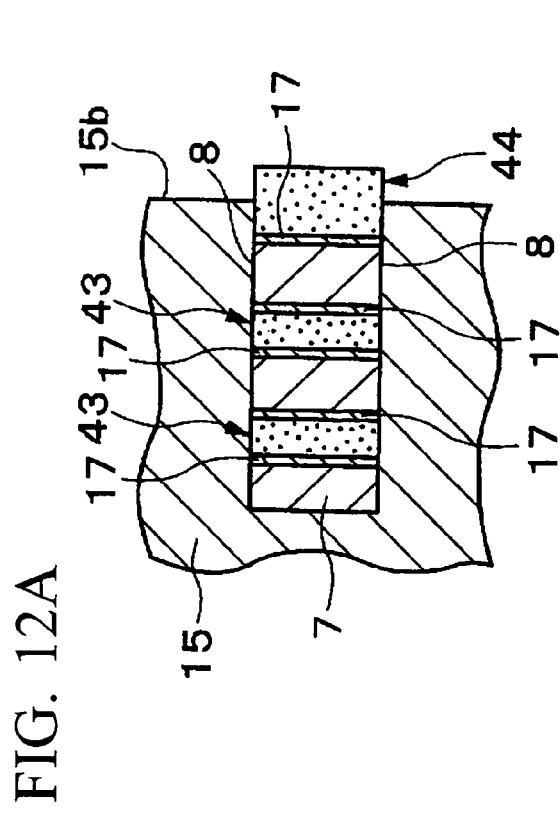
FIG. 12A is an enlarged cross-sectional view showing a further modification of the semiconductor package, in which three recesses are formed with respect to a lead.
Figure 12C:
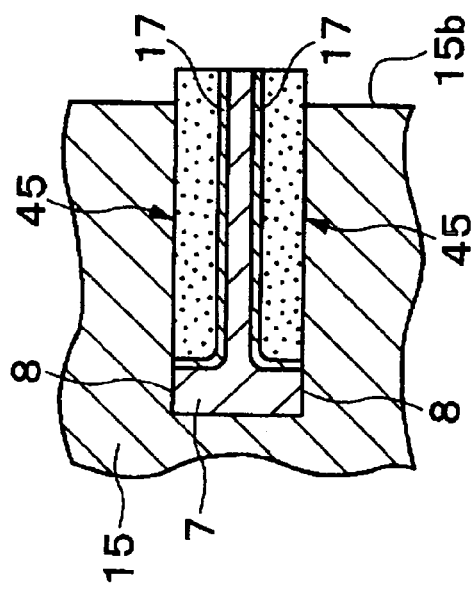
FIG. 12C is an enlarged cross-sectional view showing a further modification of the semiconductor package, in which two elongated recesses are formed with respect to a lead.

The present embodiment is designed such that the recesses 13 are not opened on two side surfaces 8 of the lead 7 lying in its width direction. This is not a restriction; hence, it is possible to provide various modifications as shown in FIGS. 12A-12C. That is, as shown in FIG. 12A, a single recess 43 may be formed and opened on the two side surfaces 8 of the lead 7. Alternatively, as shown in FIG. 12B, another recess 44 is formed in addition to two recesses 43 and is opened on the two side surfaces 8 of the lead 7 as well as the side surface of the molded resin body 15. Alternatively, as shown in FIG. 12C, it is possible to form a pair of elongated recesses 45, each of which is opened on one side surface 8 and the side surface of the molded resin body 15. Herein, the molded resin body 15 can be modified as described above by appropriately changing metal molds in such a way that resin is not introduced into the aforementioned recesses 43, 44, and 45, for example.

Figure 13A:
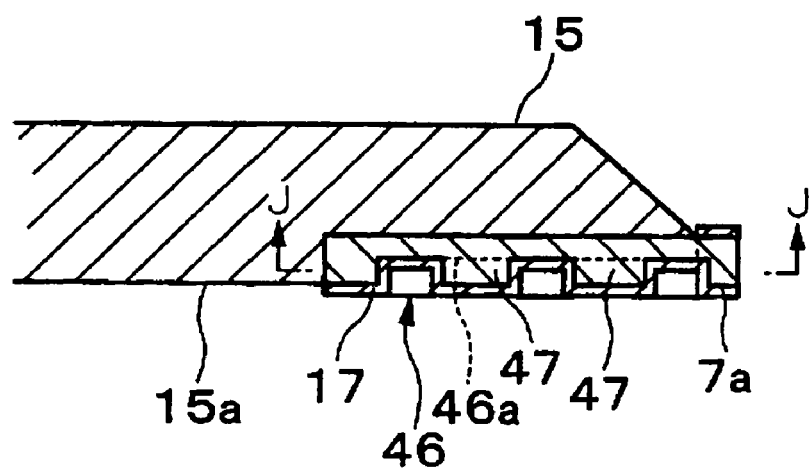
FIG. 13A is a cross-sectional view showing a further modification of the semiconductor package, in which projections are formed in addition to recesses.
Figure 13B:
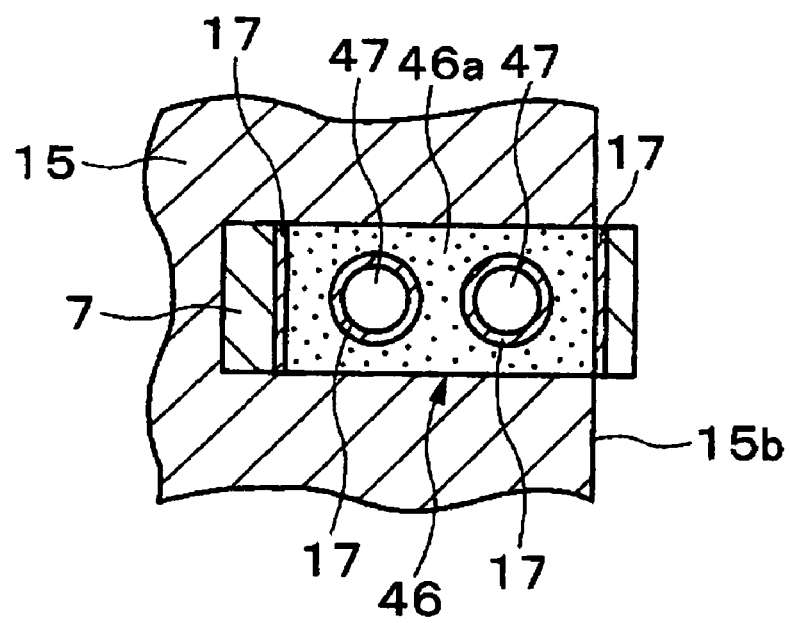
FIG. 13B is an enlarged cross-sectional view taken along line J-J in FIG. 13A.
Figure 14:
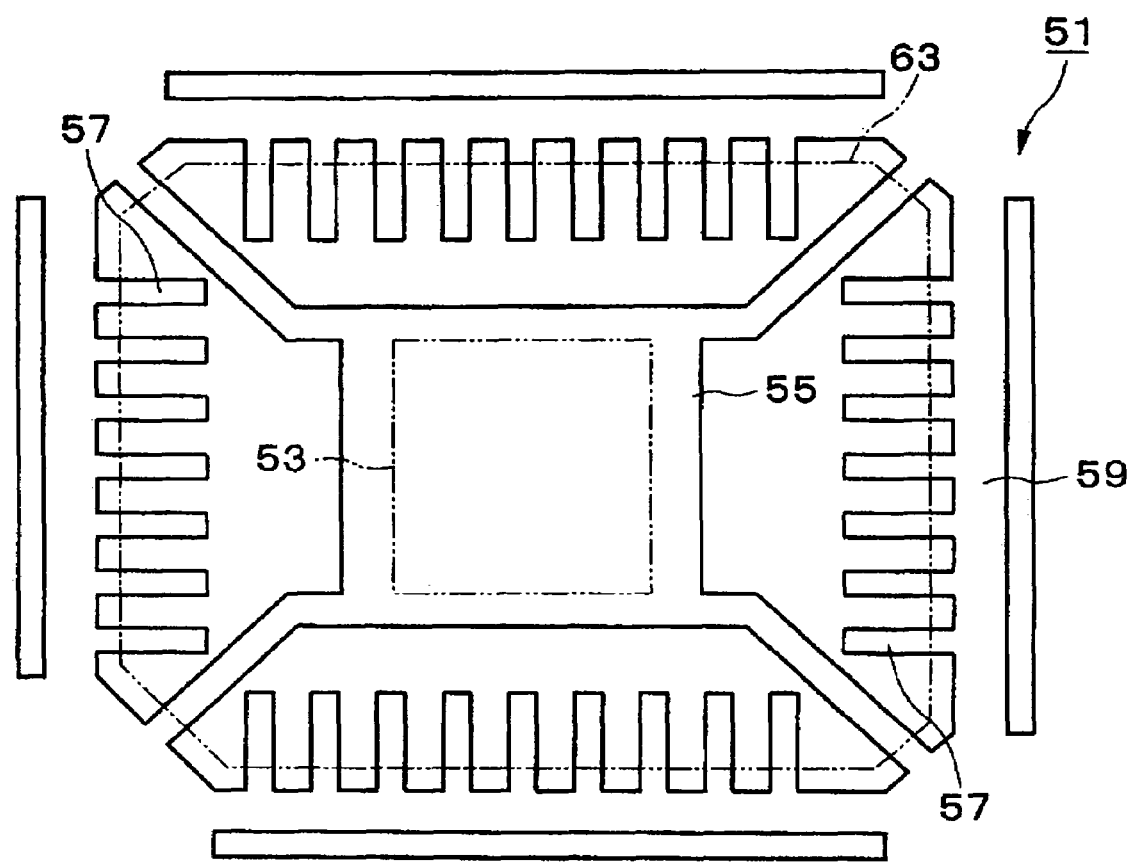
FIG. 14 is a plan view showing a conventional example of a lead frame.
Figure 15:
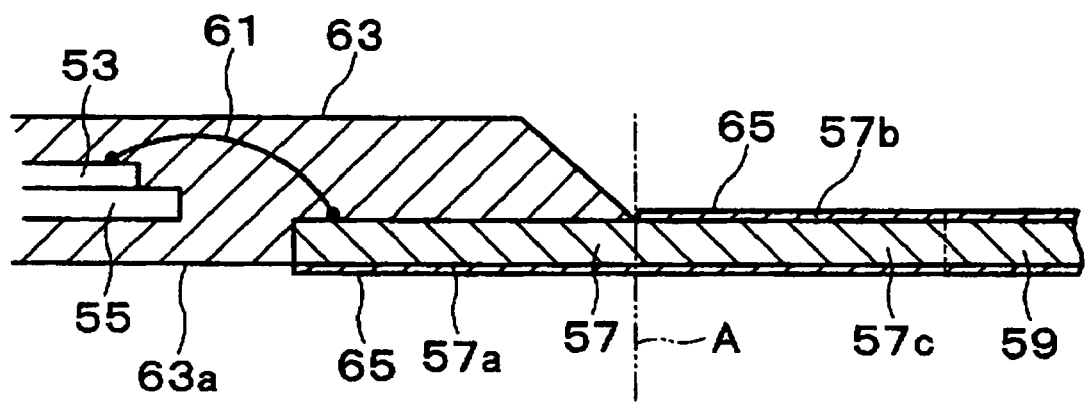
FIG. 15 is an enlarged cross-sectional view showing prescribed parts of a conventionally-known semiconductor package using the lead frame shown in FIG. 14 before its leads are cut out.
Figure 16:
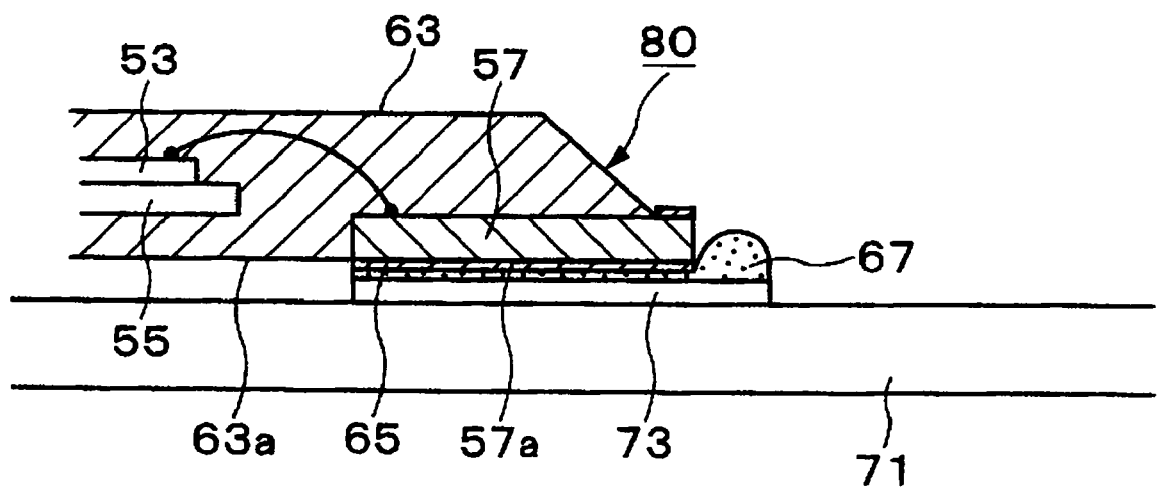
FIG. 16 is a cross-sectional view showing the semiconductor package of FIG. 15 mounted on a board.

It is possible to further modify the semiconductor package having the aforementioned recesses 13, 41, 42, 43, 44, or 45 such that, as shown in FIGS. 13A and 13B, plural projections 47 are additionally formed to project from a bottom 46a of a recess 46. This further increases the overall area of plating adhered to the lead 7. That is, it is possible to further increase the joining strength between the lead 7 and solder; hence, it is possible to further improve reliability regarding electric connection between the lead 7 and the land 23.

In the above, it is required that the tip ends of the projections 47 do not project externally from the backside 7a of the lead 7. In addition, it is required that one or more projections 47 be formed on the bottom 46a of the recess 46.

Lastly, the present invention is not necessarily limited to the aforementioned embodiment and its modifications. Any change of design and any modification that does not depart from the essentials of the present invention is intended to be embraced within the scope of the invention defined by the appended claims.

What is claimed is:

1. A lead frame that is adapted to a semiconductor package enclosed in a molded resin body and that is formed by processing a thin metal plate, said lead frame comprising:
   a stage on which a semiconductor chip is mounted;
   a plurality of leads that are arranged to encompass the stage and that are partially exposed to a terminal surface lying in a thickness direction of the molded resin body, the plurality of leads are to be wire-bonded on a first surface of each lead; and
   a plurality of lead interconnecting members for connecting the leads together,
   wherein at least one recess is formed in at least one of the plurality of leads with respect to the terminal surface of the molded resin body, the recess being formed on a second surface opposite to the first surface of each lead.

2. A lead frame that is adapted to a semiconductor package enclosed in a molded resin body and that is formed by processing a thin metal plate, said lead frame comprising:
   a stage on which a semiconductor chip is mounted;
   a plurality of leads that are arranged to encompass the stage and that are partially exposed to a terminal surface lying in a thickness direction of the molded resin body; and
   a plurality of lead interconnecting members for connecting the leads together,
   wherein at least one recess is formed in at least one of the plurality of leads with respect to the terminal surface of the molded resin body,
   wherein at least one through hole is formed to run through the lead in its thickness direction at a prescribed position allowing a cutting line, by which the leads are electrically isolated from each other, to pass therethrough.

3. A lead frame that is adapted to a semiconductor package enclosed in a molded resin body and that is formed by processing a thin metal plate, said lead frame comprising:
   a stage on which a semiconductor chip is mounted;
   a plurality of leads that are arranged to encompass the stage and that are partially exposed to a terminal surface lying in a thickness direction of the molded resin body; and
   a plurality of lead interconnecting members for connecting the leads together,
   wherein at least one recess is formed in at least one of the plurality of leads with respect to the terminal surface of the molded resin body,
   wherein at least one through hole is formed to run through the lead interconnecting member in its thickness direction at a prescribed position allowing a cutting line, by which the leads are electrically isolated from each other, to pass therethrough.

4. A lead frame that is adapted to a semiconductor package enclosed in a molded resin body and that is formed by processing a thin metal plate, said lead frame comprising:
   a stage on which a semiconductor chip is mounted;
   a plurality of leads that are arranged to encompass the stage and that are partially exposed to a terminal surface lying in a thickness direction of the molded resin body; and
   a plurality of lead interconnecting members for connecting the leads together,
   wherein at least one recess is formed in at least one of the plurality of leads with respect to the terminal surface of the molded resin body,
   wherein at least one through hole is formed to run through the lead interconnecting member in its thickness direction at a prescribed position allowing a cutting line, by which the leads are electrically isolated from each other, to pass therethrough,
   wherein the through hole is enlarged in a direction for alignment of a prescribed number of the leads.

5. A semiconductor package enclosed in a molded resin body and encapsulating a plurality of leads, which are partially exposed to a terminal surface lying in a thickness direction of the molded resin body, wherein at least one recess is formed at a prescribed position of the lead that is exposed to the terminal surface of the molded resin body, wherein the recess is not embedded in the molded resin.

6. A semiconductor package according to claim 5, wherein the lead is exposed to a side surface adjacent the terminal surface of the molded resin body, and wherein the recess is opened outwardly from the side surface of the molded resin body.

7. A semiconductor package enclosed in a molded resin body and encapsulating a plurality of leads, which are partially exposed to a terminal surface lying in a thickness direction of the molded resin body, wherein at least one recess is formed at a prescribed position of the lead that is exposed to the terminal surface of the molded resin body, wherein a secondary recess allowing a cutting line, by which the lead is subjected to cutting, to pass therethrough is formed in addition to the at least one recess on a backside of the lead in its longitudinal direction.

8. A semiconductor package according to claim 5, wherein the at least one recess is formed in a non-circular shape on a backside of the lead.

9. A semiconductor package enclosed in a molded resin body and encapsulating a plurality of leads, which are partially exposed to a terminal surface lying in a thickness direction of the molded resin body, wherein at least one recess is formed at a prescribed position of the lead that is exposed to the terminal surface of the molded resin body, wherein a secondary recess having a non-circular shape allowing a cutting line, by which the lead is subjected to cutting, to pass therethrough is formed in addition to the at least one recess that is formed in a non-circular shape on a backside of the lead in its longitudinal direction.

10. A lead frame according to claim 1, wherein the recess is formed by etching.

11. A lead frame according to claim 1, wherein the second surface, opposite to the recess of the lead, is a planar surface.

12. A semiconductor package according to claim 5, wherein the recess is formed etching.

13. A semiconductor package according to claim 5, wherein the second surface, opposite to the recess of the lead, is a planar surface.

14. A lead frame that is adapted to a semiconductor package enclosed in a molded resin body and that is formed by processing a thin metal plate, said lead frame comprising:
 a stage on which a semiconductor chip is mounted;
 a plurality of leads that are arranged to encompass the stage and that are partially exposed to a terminal surface lying in a thickness direction of the molded resin body; and
 a plurality of lead interconnecting members for connecting the leads together,
 wherein a plurality of recesses are formed in at least one of the plurality of leads with respect to the terminal surface of the molded resin body,
 wherein a plurality of recesses are formed on at least one of the plurality of leads that are isolated from each other by way of cutting.

15. A lead frame that is adapted to a semiconductor package enclosed in a molded resin body and that is formed by processing a thin metal plate, said lead frame comprising:
 a stage on which a semiconductor chip is mounted;
 a plurality of leads that are arranged to encompass the stage and that are partially exposed to a terminal surface lying in a thickness direction of the molded resin body; and
 a plurality of lead interconnecting members for connecting the leads together,
 wherein at least one recess is formed in at least one of the plurality of leads with respect to the terminal surface of the molded resin body,
 wherein the recess is opened in the side surface of the lead.

16. A lead frame that is adapted to a semiconductor package enclosed in a molded resin body and that is formed by processing a thin metal plate, said lead frame comprising:
 a stage on which a semiconductor chip is mounted;
 a plurality of leads that are arranged to encompass the stage and that are partially exposed to a terminal surface lying in a thickness direction of the molded resin body; and
 a plurality of lead interconnecting members for connecting the leads together,
 wherein at least one recess is formed in at least one of the plurality of leads with respect to the terminal surface of the molded resin body,
 wherein a projection projects from the terminal surface of the recess.

17. A semiconductor package enclosed in a molded resin body and encapsulating a plurality of leads, which are partially exposed to a terminal surface lying in a thickness direction of the molded resin body, wherein at least one recess is formed at a prescribed position of the lead that is exposed to the terminal surface of the molded resin body,
 wherein a plurality of recesses are formed in the lead.

18. A semiconductor package enclosed in a molded resin body and encapsulating a plurality of leads, which are partially exposed to a terminal surface lying in a thickness direction of the molded resin body, wherein at least one recess is formed at a prescribed position of the lead that is exposed to the terminal surface of the molded resin body,
 wherein a recess is opened in the side surface of the lead.

19. A semiconductor package enclosed in a molded resin body and encapsulating a plurality of leads, which are partially exposed to a terminal surface lying in a thickness direction of the molded resin body, wherein at least one recess is formed at a prescribed position of the lead that is exposed to the terminal surface of the molded resin body,
 wherein a projection projects from the terminal surface of the recess.

* * * * *